United States Patent [19]

Bethencourt et al.

[11] Patent Number: 5,107,428
[45] Date of Patent: Apr. 21, 1992

[54] PROCESS AND APPARATUS FOR DIAGNOSIS OF DEFECTS IN ELECTRIC OR ELECTRONIC MODULES IN AUTOMOTIVE VEHICLES

[75] Inventors: Gilles Bethencourt, Ramonville Saint-Agne; Jean-Claude Fonté, Aucamville, both of France

[73] Assignee: Actia S.A., Toulouse, France

[21] Appl. No.: 456,091

[22] Filed: Dec. 22, 1989

[30] Foreign Application Priority Data

Dec. 22, 1988 [FR] France .................. 88 17368

[51] Int. Cl.⁵ .......................................... G01M 15/00
[52] U.S. Cl. ............................ 364/424.04; 364/551.01
[58] Field of Search ................... 364/424.03, 424.04, 364/431.01, 551.01; 73/116, 117.2, 117.3, 119 R; 371/16.1

[56] References Cited

U.S. PATENT DOCUMENTS

| | | | |
|---|---|---|---|
| 4,527,424 | 7/1985 | Takahashi | 73/117.3 |
| 4,694,408 | 9/1987 | Zaleski | 364/551.01 |
| 4,748,843 | 6/1988 | Schäfer et al. | 73/117.3 |
| 4,926,330 | 5/1990 | Abe et al. | 364/431.01 |
| 4,926,352 | 5/1990 | Staffe | 364/431.01 |
| 4,962,456 | 10/1990 | Abe et al. | 364/431.01 |

Primary Examiner—Salvatore Cangialosi
Attorney, Agent, or Firm—Harold H. Dutton, Jr.

[57] ABSTRACT

The invention relates to a process and an apparatus for diagnosing defects in electric or electronic modules mounted in an automotive vehicle. This apparatus comprises a wire harness (2) adapted to divert status or control signals from a system to be tested, a formatting interface (15) comprising a plurality of calibrating modules arranged in parallel, a multiprocessor (21) connected to the formatting interface (15) and comprising a backup memory in which are stored, in real time, the defect signals, memories (25) for storage of a set of diagnostic programs corresponding to a group of systems to be tested, adapted to configure the multiprocessor (21) in such a manner as to dedicate it to the treatment of signals from a given system, and a man/machine interface (28) having means for displaying the contents of the backup memory and manual selection means.

25 Claims, 6 Drawing Sheets

PROCESS AND APPARATUS FOR DIAGNOSIS OF DEFECTS IN ELECTRIC OR ELECTRONIC MODULES IN AUTOMOTIVE VEHICLES

This invention relates to a process for diagnosing defects in electric or electronic modules mounted in automotive vehicles, modules of the type which receive status signals characteristic the static and dynamic systems of the vehicle, and generating electric signals for controlling those systems, the totality of said status signals and said control signals being representative of an set of specific parameters for the vehicle. This invention also relates to a diagnostic apparatus obtained by carrying out this process.

BACKGROUND AND OBJECTS OF THE INVENTION

Known apparatus used for carrying out diagnostics on electronic or electric modules mounted on vehicles consists of diagnostic stations supplied in central areas and permitting carrying out tests in repair stations. These stations are connected to a network of cables arranged first of all in series on the network connecting one module to a given system, and are adapted to calibrate and analyze the status and control signals passing through the network, in order to display on a screen the operating parameters of the given system. The primary disadvantages of these stations come from their very high cost price and the fact that, from their conception, their use is limited to stationary tests. Further, these stations are not adapted to test, during a given division, the totality of state or control signals generated by a module, but only the signals received from a specific element (or transmitted toward this element) connected to the module. The test of all other elements connected to the module requires therefore branching to another network. Further, the only values displayed relate to the measured operating parameters of the vehicle, the interpretation of which requires qualified personnel and the use of very complete repair manuals. Finally, their conception makes very expensive any adaptation to new types of electric or electronic modules.

Diagnostic devices are also known such as that described in European patent EP-A-0.231.607, adapted to be connected by a series connection to specific electronic or electric modules having their own means for treatment of state and control signals which they receive or generate. These units are adapted to deliver calibrated signals to the diagnostic apparatus, via the series connection. Further, the operating parameters displayed are limited to the signals delivered by the units. The function of this diagnostic device is to decode the burst of signals delivered to enable its display. The disadvantage of such devices resides in the fact that their use is limited to electronic or electric modules equipped to deliver a diagnostic raster. Further, the operating parameters displayed are limited to the signals delivered by the modules. Finally, as for the diagnostic stations, the only values displayed concern the measured operating parameters, the interpretation of which necessitates the use of very complete repair manuals.

The present invention seeks to overcome the drawbacks of known devices and has as a first object to provide a low cost diagnostic device relative to prior diagnostic stations, permitting testing of all types of units having, or not having, a diagnostic scanning raster.

Another object of the invention is to permit carrying out full scale road tests.

Another object is to permit detecting and displaying transient defects arising unexpectedly during a road test.

Another object is to provide directly to the operator the interpretation of the defect signal detected and to guide the operator in carrying out the repair.

Another object is to provide an apparatus adaptable at low cost to all new types of modules.

DESCRIPTION OF THE INVENTION

To this end the invention provides a process for diagnosing defects in electric or electronic modules mounted in an automotive vehicle, modules of the type receiving electric status signals characterizing the static and dynamic status of elements of the vehicle and generating electric signals for controlling said elements, the totality of said status signals and control signals being representative at each moment of a set of specific parameters of the vehicle, called operating parameters, the one or more modules to be tested for a given vehicle being designated as the "system to be tested."

According to the invention, this process is characterized in that it comprises:

storing preliminarily in storage memories, diagnostic programs each corresponding to a type of system to be tested, and associated with each diagnostic program a set of default thresholds connected to each operating parameter corresponding to the system concerned, continuously selecting the status signals and the control signals at the terminals of the modules of the system to be tested, in such a manner as to continuously arrange said signals in a parallel stream, formatting said signals, simultaneously and in parallel, in order to bring them into a predetermined range of values and to obtain calibrated signals, preselecting by a manual command the diagnostic program corresponding to the type of system tested, and the associated default thresholds, configuring a multiprocessor by means of the selected diagnostic program, in order to dedicate it to the treatment of specific status signals and control signals of the type of the system tested, and to provide on one of the status or control signals a prioritized character, digitizing, by means of the configured multiprocessor, the calibrated signals and the combinations of said signals over a period related to the prioritized signal, of a duration less than that of the period of the prioritized signal, in such a manner as to generate during said period a set of digital signals representative of the calibrated signals, storing the digital signals obtained for each period in a read-write memory, scanning said read-write memory for each period and calculating in real time a set of values representative of the operating parameters for the period considered, comparing, in real time, each calculated value to the default thresholds preliminarily stored and selected, in order to generate a default signal in case it is exceeded, storing in real time the eventual default signal for each value in a backup memory having a first zone of a capacity at least equal to the number of operating parameters, counting down, for each value, the number of appearances of the corresponding default signal and storing at least one datum related to this number in a second zone of the backup memory, displaying, on request, the contents of said backup memory.

This process thus permits, in real time, calculation of representative magnitudes of operating parameters corresponding to the system tested and storing in a backup memory the eventual default signals which may then be displayed on demand. It authorizes carrying out normal road tests, in place and instead of static tests usually carried out, and supervising during this test all of the status or control signals received or generated by the system tested. Thus, any defects, even transient, arising during this test are detected and stored.

According to a preferred embodiment of the invention:

preliminarily upon display of the contents of the backup memory, a predetermined combination of information to be displayed is selected from a set of corresponding combinations of different types of diagnoses, only the selected combination of information is displayed.

As will be understood better hereinafter, several types of tests other than the road test may then be carried out, and in particular: verification of the wiring of the testing hookup, measurement of the parameters in relation to the tested system ... For each of these tests, only the selected data is displayed.

The selection of the diagnostic program of the system to be tested and the combination of data to be displayed is preferably carried out:

by generating the successive display of menus carrying representative indications of the stored types of systems to be tested and the combination of data to be displayed, by actuating a cursor for selecting indications contained in the menu.

This selection is carried out easily by reading successive menus and branches comprising the various characteristics necessary for carrying out the process for a system to be tested and for a given type of test.

Further, according to another characteristic of this invention:

stored in a storage memory are a table of aids for the repair of each defect signal when this defect signal is displayed.

This table of aids integrating the troubleshooting information and connected to the defect signals displayed constitutes a guide furnishing directly to the user the source of the problem.

The invention also relates to a diagnostic apparatus characterized in that it comprises in combination:

a set of wire bundles, each bundle having at one end a standard connector and at its other end a branch-connector adapted to be branched to the terminals of a module of a system to be tested in order to receive the status signals and the control signals, a formatting interface provided with input connectors conjugate with the standard connectors of the wire bundles, said interface comprising a plurality of calibrating modules arranged in parallel on the inputs, a multiprocessor, connected to the formatting interface and comprising a plurality of counters and analog/digital converters, at least two processors organized as master/slave, a read/write memory for storing in real time the digital signals obtained and a backup memory for the storage of the defect signals and data tied to these defect signals, memories for storage of a set of diagnostic programs corresponding to a set of systems to be tested, said memories being connected to the multiprocessor, connection means adapted for connecting the multiprocessor with a man/machine interface having display means and manual selection means, electric feed means provided with a connector for connection with a battery of an automobile, said means being adapted to convert the battery voltage to an appropriate regulated voltage for supplying to the apparatus.

As will be seen below, in addition to the advantages described above, the concept of the invention permits providing a diagnostic unit of dimensions adapted to be carried inside of a vehicle, either in the motor compartment or in the passenger compartment, for carrying out road tests.

Further, according to two other characteristics of the invention:

the formatting interface comprises an interchangeable card comprising a removable pin input connector having a plurality of ways for connection, corresponding to standard connectors, a removable pin output connector having a plurality of ways for connection with the multiprocessor and, arranged in parallel between these connectors, the calibration modules.

the memories for the storage of the diagnostic programs are carried by an interchangeable card comprising a bidirectional, removable pin connector, for the connection of said memories to the multiprocessor.

This system of interchangeable cards permits, at low cost, adapting the diagnostic apparatus to different evolutions of systems to be tested and, as a result, to provide an apparatus open to all technological developments of automotive vehicles.

The invention also relates insofar as essential means for the provision of this diagnostic device, to a formatting interface, characterized in that it comprises:

a removable pin input connector having a plurality of paths, a removable pin output connector having a plurality of paths, a plurality of calibration modules arranged in parallel between the input and output connectors.

DESCRIPTION OF THE DRAWINGS

Other characteristics, objects and advantages of the invention will become apparent from the detailed description which follows in reference to the accompanying drawings which show by way of non-limiting examples a preferred embodiment and a variation thereof. In these drawings which form an integral part of the present invention.

DESCRIPTION OF PREFERRED EMBODIMENTS

Figure 1:
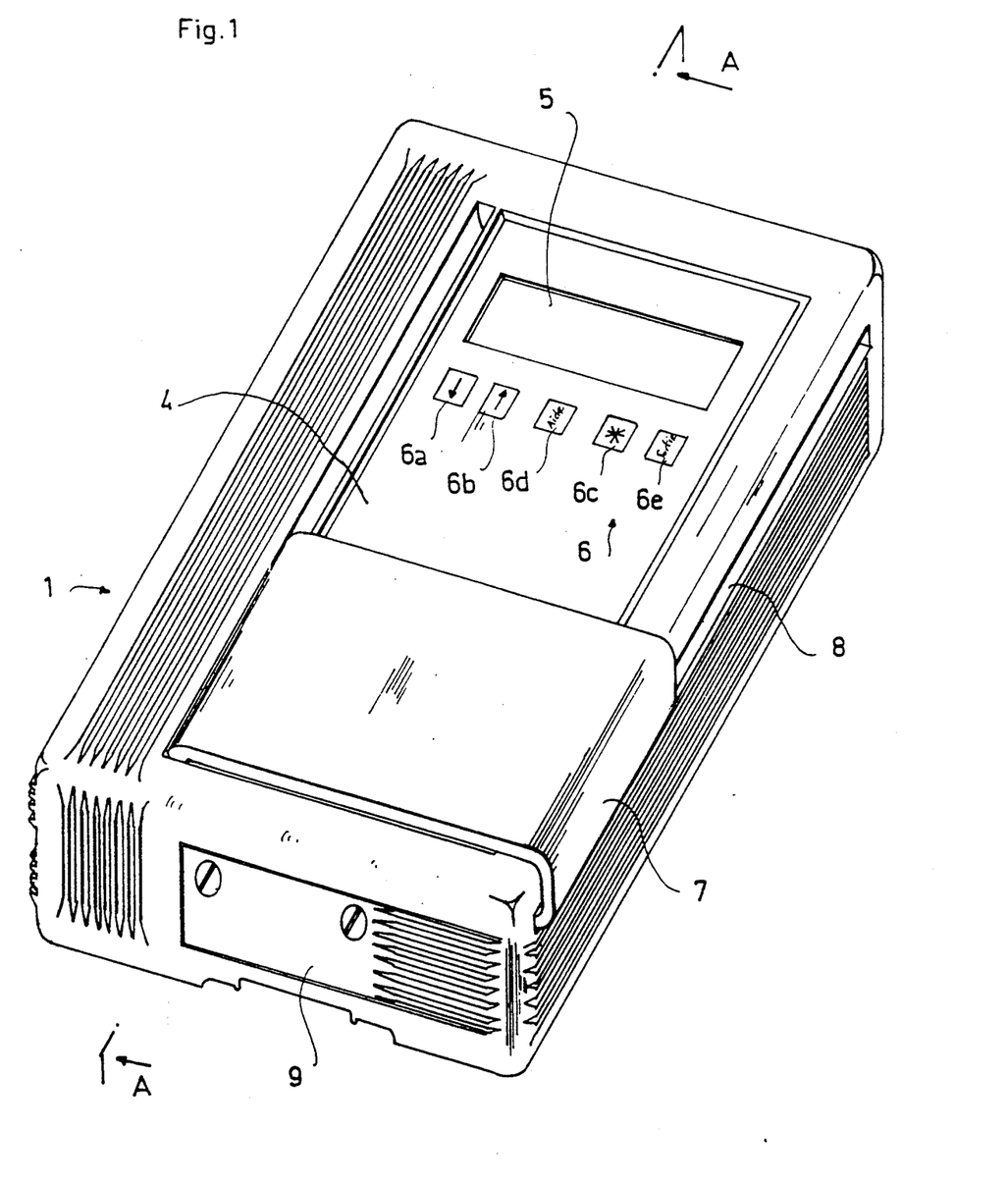
FIG. 1 is a perspective view of a diagnostic apparatus according to the invention.
Figure 3:
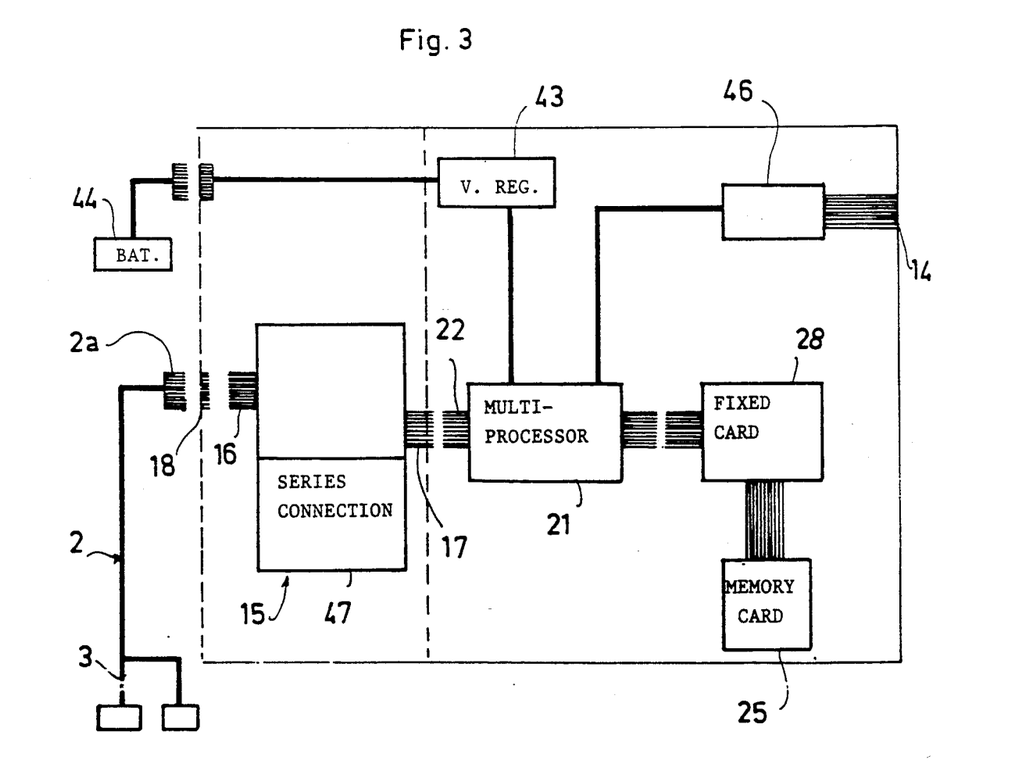
FIG. 3 is a block diagram of this device.

The diagnostic apparatus shown in the drawings is presented in the form of a diagnostic box 1 of a rectangular parallelipipedic shape. This box 1 is intended to be connected to the terminals of electric or electronic boxes through electric wire harnesses 2 provided with a junction 3 permitting directing to the device status signals received by these electronic boxes and control signals generated by the latter.

This diagnostic box 1 has a height on the order of 80 mm, a width on the order of 150 mm, and a length on the order of 300 mm and is made of aluminum. These dimensions and this material permit easily carrying the box inside of a vehicle, either in the motor compartment or in the passenger compartment thereof.

Figure 2:
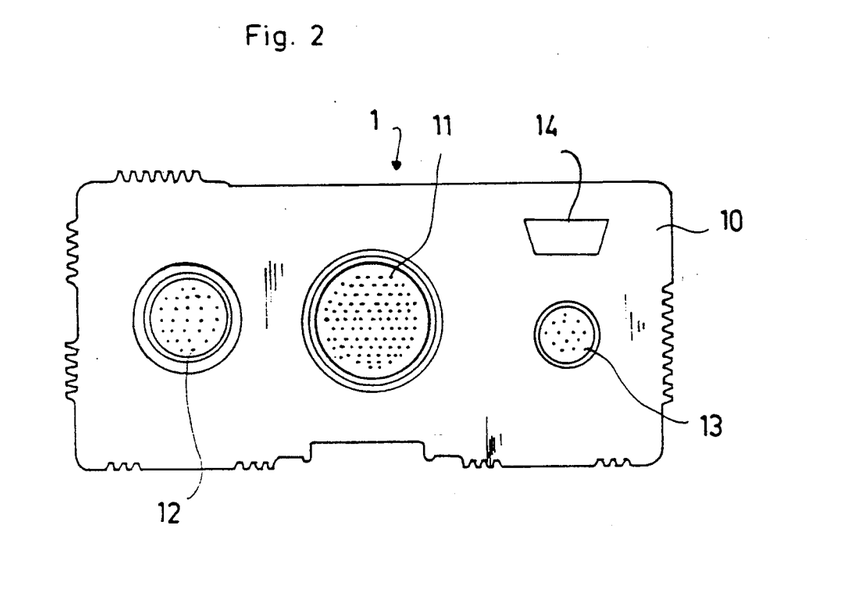
FIG. 2 is a plan view of one of the end faces of this device.

One of the front faces of this diagnostic box comprises a window 4 to the rear of which are arranged an alphanumeric screen 5 of four lines by 20 characters, and five sealed, manual selection buttons 6. This front face is also provided with a protective cover 8 mounted on slides 8 to be movable between two positions: one position where it hides and protects the display screen 5 and the manual selection buttons 6, and a position where it reveals the latter.

Figure 4:
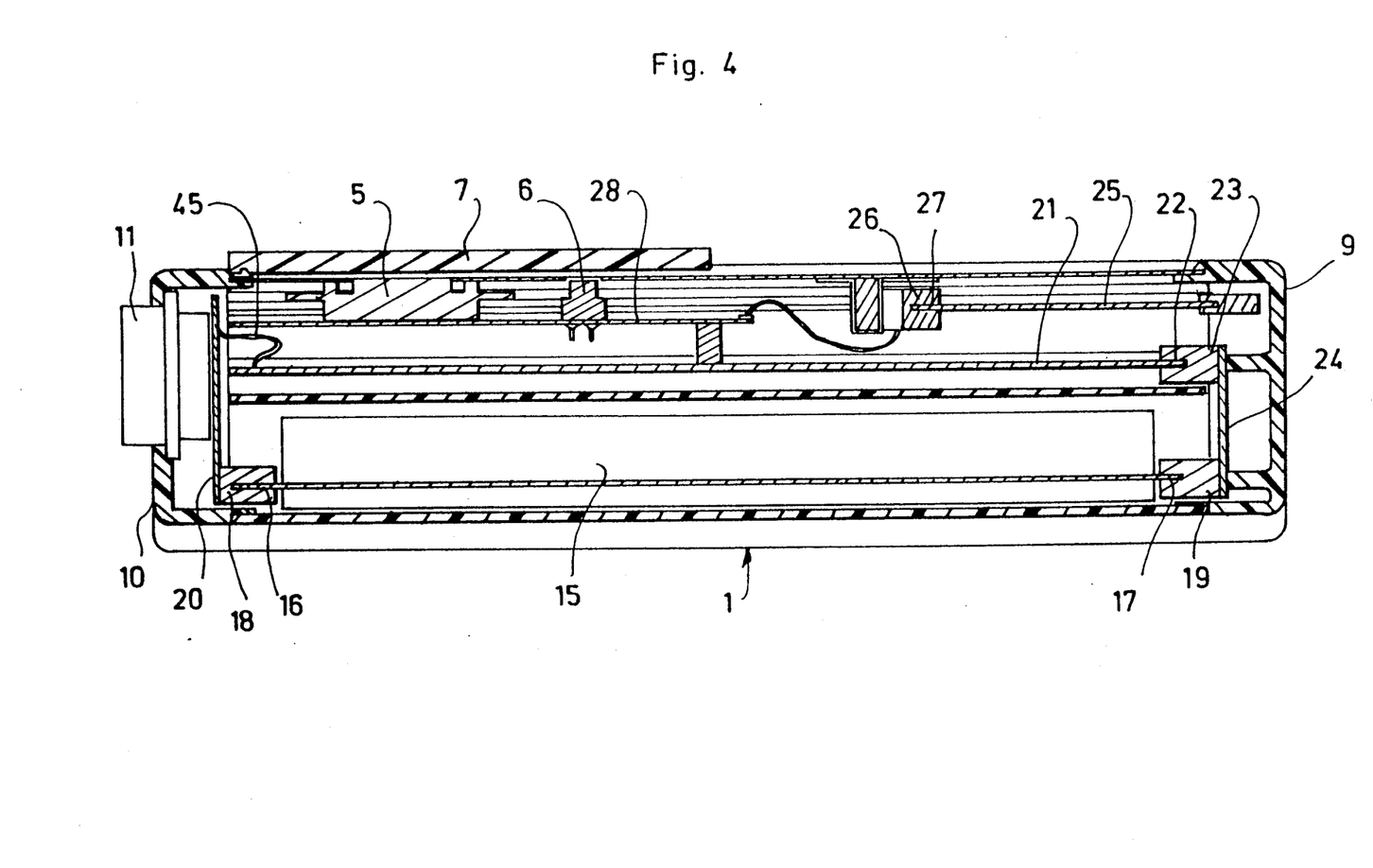
FIG. 4 is a longitudinal cross section through vertical plane A.

The diagnostic box 1 is open at its two ends and provided internally with longitudinal slots for plugging in of cards. The open ends are also closed by two cover members, a removable one 9 carrying the inter-card connections, and the other one 10 fixed carrying accessible connectors: a 63-pin connector 11 and a 28-pin connector 12 corresponding to the standard connectors 2a of the harness 2, a feed connector 13 and a 9-pin connector 14.

The cards enclosed on the interior of this diagnostic box 1 are four in number:

an interchangeable formatting card 15 comprising a pin-type input connector 16 having a plurality of pins corresponding to the standard connectors 2a of the wire harness 2, and a pin-type output connector 17 having a plurality of pins. This formatting card 15 is plugged into the card slot connectors 18, 19 carried respectively by each of the members 9, 10, the connector 18 carried by the fixed member 10 being connected by an electric circuit 20 to the 63-pin connector 11 and 28-pin connector 12 and to the feed connector 13, a fixed multiprocessor card 21 comprising a plug in input connector 22 plugged into a connector slot 23 carried by the removable member 9 and connected by an electric circuit 24 to the card slot connector 19 connected to the formatting interface, an interchangeable card 25 bearing the diagnostic program storage memories corresponding to the set of systems to be tested. This card 25 is plugged into a fixed card slot connector 26 and comprises a bidirectional plug-in connector 27 for the connection of the diagnostic memories with the multiprocessor card 21, a fixed card 28 for connection with the display means and manual selection means 5, 6 connected in a plug-in manner to the multiprocessor card 21 and to the fixed insertable connector 26 of the memory storage card 25, in such a manner as to assure the connection between the latter and the multiprocessor card 21.

In the first case, the formatting card 15 comprises, arranged in parallel between its connectors 16, 17, a plurality of calibrating modules of the following type: module 29 for comparison of the status signal or command signal with a calibration threshold, in order to deliver a logic signal as a function of the comparison, traveller amplifier module 31 able to produce a customizing in order to deliver a calibrated analog signal, and ground controller module 30 able to compare the impedance of the input to a calibration threshold in order to deliver a logic signal as a function of the comparison.

Figure 5:
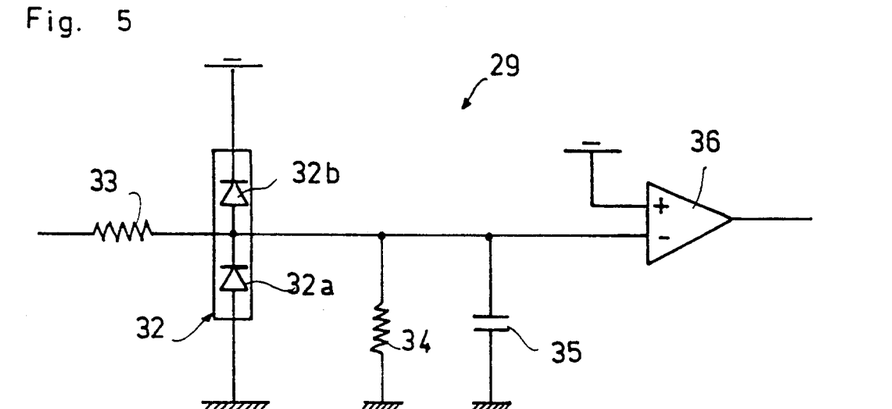
FIGS. 5, 6, 7 are electronic schematic diagrams of calibration modules of this apparatus.

As in shown in FIG. 5, the comparison modules 29 comprise an input protection block 32 comprising two diodes 32a, 32b, adapted to permit delivery of a signal of a voltage extending in a range of values essentially between the feed voltage and ground. From part to part of this protection block are arranged resistances 33, 34 intended to lower the intensity of the current selected in such a manner as to not disturb the operation of the unit tested. The signal is then filtered by means of a filter capacitor 35 then delivered to the minus input of a comparator 36, of which the plus input is fed with a reference voltage. This comparator 36 delivers a logic signal of a level 0 or 1 as a function of the voltage of the input signal feeding its minus input.

Figure 6:
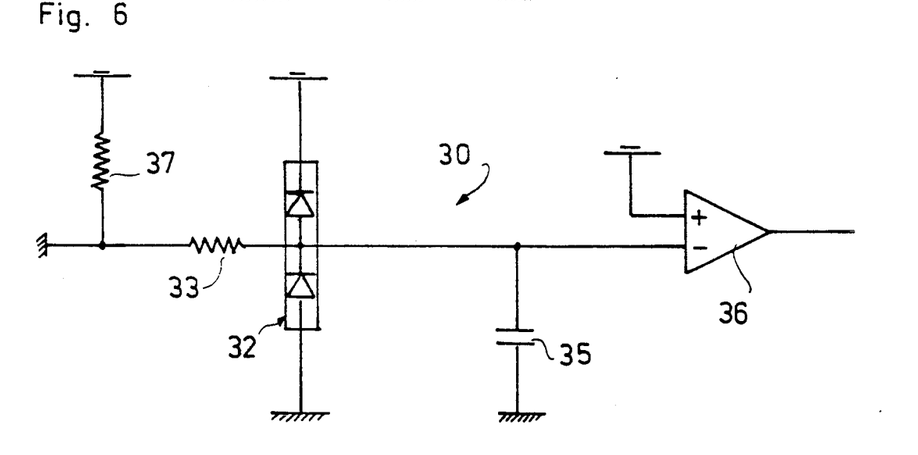

As is shown in FIG. 6, the ground control modules 30 have the same principle as the comparison modules 29 described above. They comprise in place of the resistance 34 of these modules 29, a resistance 37 connected between the feed voltage and the associated ground circuit and adapted to deliver to the minus input of the comparator 36 a predetermined voltage signal defining a normal function.

Figure 7:
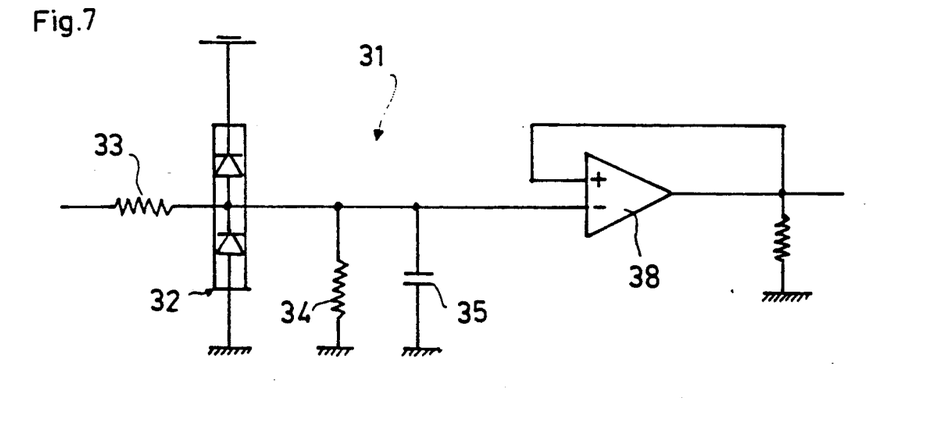

The traveller modules 31 shown in FIG. 7 are identical to the comparison modules 29 as to the components used, except for the comparator 36 replaced by an amplifier 38 mounted in the follower and adapted to deliver a voltage of between 0 and 5 volts identical to the input voltage without disturbing the operation of the unit tested.

The digital and analog signals calibrated by the formatting card 15 are delivered in parallel to the plug-in input connector 22 of the multiprocessor card 21.

Figure 8:
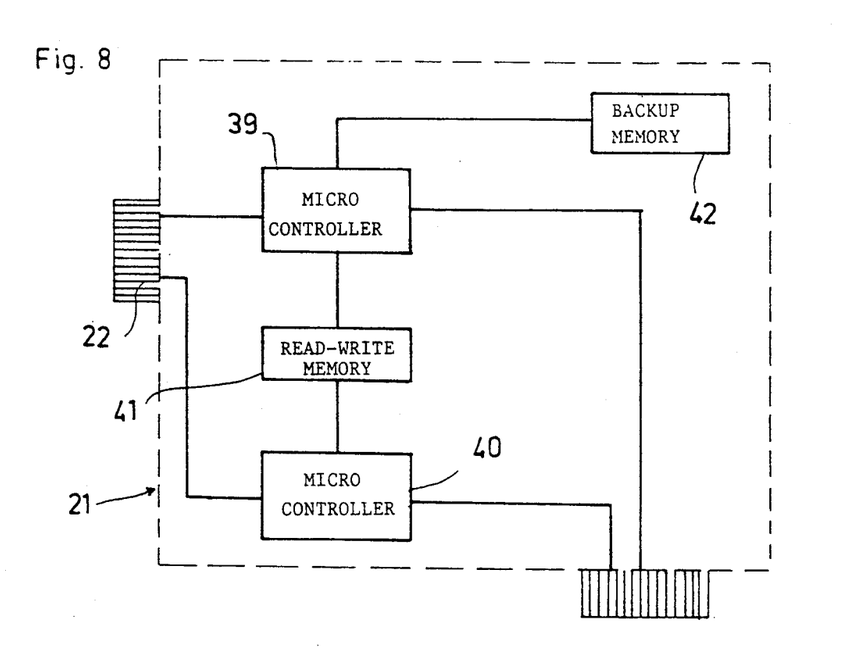
FIG. 8 is a block diagram of the multiprocessor of this apparatus.

This multiprocessor card 21 comprises firstly two microcontrollers: a master microcontroller 39 and a slave microcontroller 40 to which are distributed the pins of the plug-in input connector 22.

Each microcontroller 39, 40 comprises a processor, at least six counters associated in groups of different power, in order to carry out measures of time on the calibrated logic signals, and a plurality of multi-pin converters, of a number adapted to digitize in parallel the analog calibrated signals. The master microcontroller 39 thus comprises four converters and the slave 40 comprises 11. These microcontrollers 39, 40 thus each comprise a read write memory for storage in real time of the digital signals obtained.

The dialog between these microcontrollers 39, 40 is established through the intermediary of a read write memory 41 in which these microcontrollers write and read.

In the last place, the multiprocessor 21 comprises a backup memory 42 for the storage of signals of defects and data connected to these defect signals.

This multiprocessor card 21 comprises, in addition, a feed converter 43, of a known type, adapted to deliver from the voltage of the battery 44 of an automotive vehicle, a regulated voltage of five volts.

The multiprocessor card 21 is further connected by an electric circuit 45 to the 9-pin connector 14 to provide a connection to an exterior system for exchange with the multiprocessor. This connection is a series connection conforming to the RS232C standard and to this effect the multiprocessor card 21 comprises an interface for the adaptation of signals of a type known per se. This series connection is used in order to enable the operation of the diagnostic apparatus blindly, the selection means and display means being transported in an external system such as a diagnostic station.

The multiprocessor card 21 comprise a second series connection 47 using two pins of the 63-pin connector 11 and transporting through the formatting card 15 to the multiprocessor. This series connection 47 is in conformance with the ISO DP 9141 standard of September, 1986 and of type K and L. It permits treatment of bursts of diagnostics delivered by the specific electronic or electric modules described above.

The interchangeable card 25 carries the two memories for storage of diagnostic programs of each of the two microcontrollers 39, 40.

Finally, this diagnostic apparatus is associated with a set of harnessed cables 2 comprising resistors wired in these harnesses, and differing from one bundle to the next. These resistors constitute the electric parameters identifying each system to be tested, to which is associated, in each diagnostic program, a code representative of said system to be tested.

Figure 10:
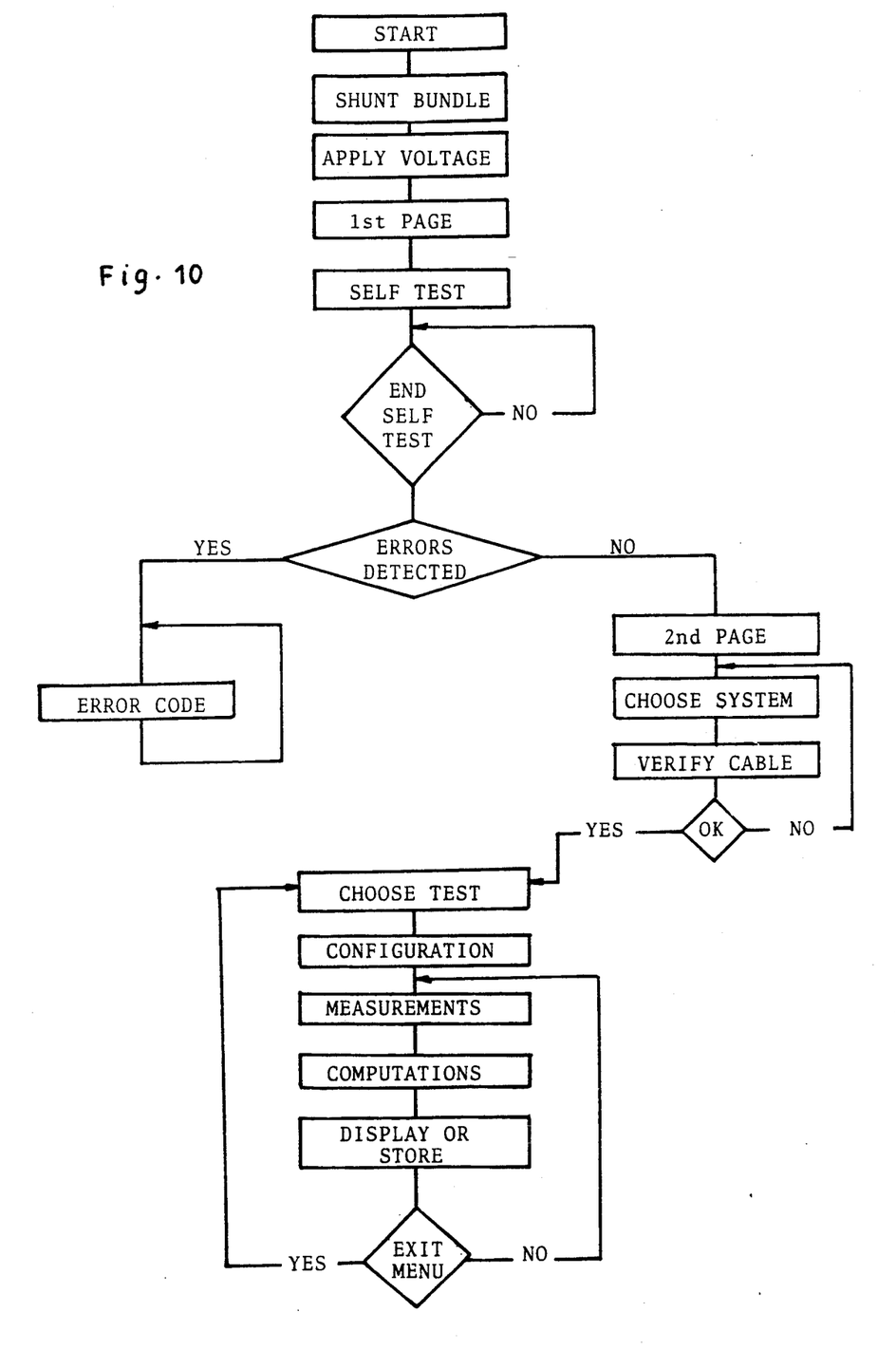
FIG. 10 represents the logic diagram for the general operation of this apparatus.

The logic diagram of the general operation of this diagnostic apparatus is shown in FIG. 10. The preliminary steps comprise connecting the diagnostic box 1 to the terminals of an electronic module by means of a preselected wire harness 2, then supplying voltage to the diagnostic box 1.

After the voltage is supplied, one stored page is displayed on the alphanumeric screen and the master processor 49 and slave processor 40 proceed to their own self-test consisting of testing the good operation of the multiprocessor members. The result of this self-test is carried out by the master processor 39 which receives in particular the results of the self-test of the slave processor 40. When errors have been detected during this self-test, an error code associated with the unit in default is displayed.

In the opposite case, the next step consists of selecting the type of system to be tested.

For carrying out this choice, the operator provides a menu comprising the various types of systems able to be tested. It is necessary to pass to the screen 5 the lines of this menu by means of two keys, down arrow 6a and up arrow 6b, and selecting the desired line by means of a VALID key 6c.

Once this choice is carried out, the multiprocessor verifies the concordance between the electric parameter of a harness 2 and the code stored in the diagnostic memory. A non-concordance causes the return to the menu for selection of systems to be tested. The actuation of a HELP key 6d causes, in this case, the display of a help message indicating to the user the reference to the cable which ought to be used.

Otherwise the user proceeds to select the type of test which he desires to carry out. The basic tests proposed consist of:

a wiring test which permits checking the wiring of the testing hookup, a road test which permits revealing temporary and permanent defects, during operation of the vehicle, tests specific to the system tested, such as a test for the start of an injection system or a lighting system.

The selection of the system to be tested and of the type of test to be carried out brings about the configuration of the multiprocessor by means of diagnostic programs which, especially for a road test:

attach a priority signal to a preselected status or command signal, order the set of status and command signals in at least one hierarchal classification, while alloting to them for each class a predetermined hierarchal weight, aiming, upon appearance of a defect signal on a magnitude of a given class, to inhibit the possible defect signals of magnitudes of the same class corresponding to the signals of a lower hierarchal weight, attach to one of the classes a privileged character seeking to inhibit defect signals of other classes in case of the appearance of a defect signal in said privileged class, include the associated defect threshold.

From this configuration, the multiprocessor unlatches in real time the measures and controls which must be carried out, and proceeds to the acquisition of different data which it stores in the read-write memories.

The read-write memories contain the parameters relating to data acquired over a period connected to the priority signal, are then explored in real time and the multiprocessor calculates a set of the magnitudes representative of the operating parameters. The magnitudes are compared to the defect thresholds and the resulting defect signals are stored in the backup memory 42, either as a temporary defect or as a permanent defect. This concept of temporary or permanent defect considers the number of appearances of the defect.

Once the road test has been carried out, the operator may display the contents of the backup memory and cause to appear, by means of the HELP key 6d, a help message for the repair for each defect displayed.

An example of the use of this diagnostic unit 1 for the test of an injector of the MOTRONIC type for a Peugeot 405 is described hereinafter.

The choice of the system to be tested is displayed by the operator upon appearance on the screen of the following page. The actuation of the HELP key 6d causes the appearance of the help message also shown below:

```
CHOICE OF PRODUCT
       LE31 INJECTOR
    ALL. TRANSISTORIZED
       >MOTRONIC 405
       ---END OF PAGE---
```

```
HELP: Select the product        HELP: To change your
      to be tested                     choice:    >OUTPUT
      enter: >*
```

This selection operates while displacing the cursor by means of the up or down arrow keys 6b, 6c, and while validating the choice once this cursor is opposite the desired system.

The system being chosen, the multiprocessor configures itself in such a manner as to treat all of the signals generated or received by the latter according to the following table:

| CONFIGURATION OF THE MULTIPROCESSOR FOR THE TREATMENT OF THE MOTRONIC INJECTOR | |
| --- | --- |
| SIGNAL TO BE TREATED | AFFECT ON THE MULTIPROCESSOR |
| INJECTORS FIRING COMMAND PRIMARY WINDING RETARD SOLENOID VALVE | MASTER PROCESSOR COUNTERS |
| NORMAL SENSOR OPERATION | SLAVE PROCESSOR COUNTERS |
| TEMPERATURE OF WATER TEMPERATURE OF AIR | MASTER PROCESSOR ANALOG PINS |
| VREF FLOWMETER FLOW OF AIR RETARD CONTROL | SLAVE PROCESSOR ANALOG PINS |
| MASS CONTROL | SLAVE PROCESSOR LOGIC PINS |
| PUMP RELAY FEEDS | MASTER PROCESSOR |
| LIFT FOOT - GAS FULL | LOGIC PINS |
| DIAGNOSTIC CONNECTION | SLAVE PROCESSOR |

The following menu, such as indicated above, permits the operator the carry out the selection of the type of test desired.

```
*MOTRONIC 405*
     WIRING TEST
     ROAD TEST
     STARTUP TEST
  >MEASURE PARAMETERS
     ---END OF PAGE---
```

If, for example, the choice of a measuring test is made, at least one fraction of the read-write memory is then displayed in real time permitting visualizing the value of the operating parameters indicated below:

```
*MOTRONIC*  0000tr/mn
   Vbat.: 00.0 Volts
   Advance: 00 dégrees
   Tps. Load: 000.0 ms
   Regl. retard: 00.0 V
   Flow of air: 00.0 V
   Water Temp: 00.0 V
   Air Temp: 00.0 V
   Ev. Ret. RCO: 00%
   Throttle: retard
   ---END OF PAGE---
```

The test, calculations and displays of the operating parameters are then carried out until stopping the treatment and display of the page comprising the menu of tests.

If the choice carries then a road test, the diagnostic being carried out on a system (injection), of an associated part with a rotating element, to know the rotating ignition target, called a speed signal, representative of the speed of this rotating member and its angular position at each instant, the multiprocessor is configured in such a manner as to assign a priority character to this speed signal.

Further, the microprocessor is configured in such a manner as to direct the status and control signals in at least five classes to be arranged in the following order:

first class having a priority character: battery voltage signal, weight control signal second class: speed signal generated by the firing target, signals from ignition coils, third class: speed signals generated by the firing target, signal from the pump relay, injector control signal, fourth class: flowmeter signals, air temperature sensor signals, fifth class: solenoid valve signal, water temperature sensor.

The following page is then displayed on the screen permitting the operator to select the zone of the backup memory 42 is which will be stored the defect signals, the remaining zone permitting carrying out a similar test on a second vehicle.

```
*MOTRONIC 405*
  > Rolling Vehicle 1
    Rolling Vehicle 2
  Analyze Vehicle 1 Defect
  Analyze Vehicle 2 Defect
    ---End of Page---
```

The starting of the road test erasing the contents of the aforementioned zone of the backup memory 42, the operator is then alerted as indicated below:

```
ATTENTION: This test
  erases the defects
     confirm: > *
  If Not: > EXIT
```

Following actuation of the VALID key 6c, the apparatus carries out the tests before rolling in order to detect eventual major defects making the road test useless and detecting especially:

the absence of contact as indicated below with the associated help pages:

```
*MOTRONIC ROAD TEST*
        START
    Test before rolling
  Absence 12V ALL and INJ
```

```
HELP: If you have the
same message after having
set the contact
>HELP
```

```
VERIFY/REPAIR
12 V after contact
``` the other tests during the rolling, of which are displayed the following page:

```
*MOTRONIC ROAD TEST*
  CONTROL IN PROGRESS
```

The end of these tests is signaled by the display by the page below which permits the operator, either to continue the road test or to stop the same.

```
*MOTRONIC ROAD TEST*
  ABSENCE OF DEFECTS
     CONTINUE: >*
     IF NOT: >EXIT
```

In the first hypothesis, the road test is effectively started, materialized on the screen by the display of the following page:

```
*MOTRONIC ROAD TEST*
        RUN
```

Further, during the running of this test, the operator is visually informed of the detection of defects by the appearance of the following message:

```
*MOTRONIC ROAD TEST*
        RUN
       DEFECT
```

Once the test is completed, the actuation of the EXIT key 6e causes stopping of the road test and the return to the menu indicated below permitting selection of the following step for seeing the defects:

```
*MOTRONIC 405*
 Rolling Vehicle 1
 Rolling Vehicle 2
>Analyze Vehicle 1 Defect
 Analyze Vehicle 2 Defect
 ---END OF PAGE---
```

These defects are then successively displayed on demand, with for each defect, information helpful for troubleshooting, accessible from the HELP key 6d. By way of example, shown below are the defect signalization of the operation of the slowed electrovalve as well as the associated help page:

```
*MOTRONIC ROAD TEST*    VERIFY/REPAIR
Temporary defect         Inj. wire n. 33:
directs electovalve      Ev.Ral. Wiring or
slowdown                 Injection module
```

All of the defects may thus be visualized, the end of the enumeration thereof being signified by the appearance of the following page associated with its help page:

```
*MOTRONIC ROAD TEST*    HELP: for doing a
  NO OTHER DEFECTS      new test: >*
                        If not: >EXIT
```

Such as apparatus therefore constitutes an easily used diagnostic device, because its principle of operation is based on an interactive man/machine interactivity putting forth to the maximum which permits, with the help of the HELP key 6d, guiding the used in all his commands. Further, in the defect analysis phase, this user has access to help tables for easily troubleshooting the repair of the engine trouble discovered.

Figure 9:
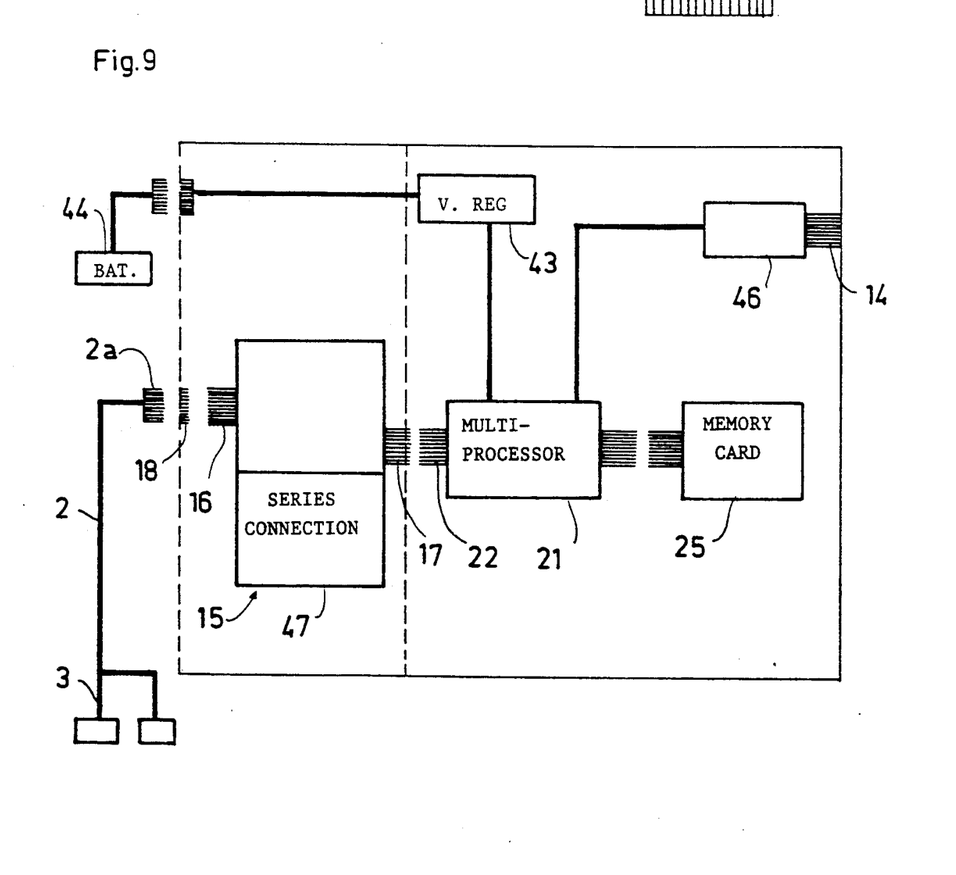
FIG. 9 is a block diagram of a variation.

According to a variation and as shown in FIG. 9, this diagnostic unit 1 may also operate blindly, that is without display means and manual selection means proper. At this moment, the unit is connected by a series connection with an external exchange system with the multiprocessor which comprises display means and manual selection means.

We claim:

1. A process for diagnosing defects in electric or electronic modules mounted on automotive vehicles, said modules being of the type receiving electric status signals characteristic of the static and dynamic state of components of the vehicle and generating electric control signals for controlling said modules, said status and control signals being representative at each moment of a set of specific operation parameters of the vehicle, said process comprising:

preliminarily storing in storage memories diagnostic programs corresponding to each type of system to be tested, and a set of default thresholds related to each operating parameter associated with each of said diagnostic programs for each of said systems, continuously comparing the status and control signals to the limits of the modules of the system to be tested, in such a manner as to continuously arrange said signals in a branch network (2), simultaneously and in parallel formatting said signals for bringing them into a range of predetermined values and obtaining calibrated signals, selecting by a manual command the diagnostic program corresponding to the system to be tested, and the associated default thresholds, configuring a multiprocessor (21) by means of a selected diagnostic program for dedicating it to the treatment of status and control signals specific to the system selected and imposing on one of the status or control signals a priority bit, digitizing, by means of the configured multiprocessor (21) the calibrated signals and the combinations of said signals over a period related to the priority signal, of a duration lower than that of the period of said priority signal, in such a manner as to generate during said period a set of digital signals representative of the calibrated signals, storing the digitized signals obtained during each period in a read write memory, searching said read write memory at each period and calculating in real time a set of values representative of the operating parameters for the period considered, comparing in real time each calculated value to the default thresholds preliminarily stored and selected for generating a default signal in case of excess, storing in real time for each value the resulting default signal in a backup memory (42), said backup memory having a first zone with a capacity at least equal to the number of operating parameters, counting down for each value the number of appearances of the corresponding default signal and storing at least one datum related to this number in a second zone of the backup memory (42), and displaying the contents of the backup memory as an indicator of deflective conditions of said modules.

2. A diagnostic process as in claim 1 and including configuring the multiprocessor (21) by means of a diagnostic program selected in such a manner as to sequence the set of status and control signals in at least one hierarchal class, while allocating to them, for each class, a predetermined hierarchal weight, and upon appearance of a default signal on a value of a given class, inhibiting the resulting default signals of values of the same class corresponding to signals of lesser hierarchal weight.

3. A diagnostic process as in claim 2, and including configuring the multiprocessor (21) in such a manner as to allocate to one of the classes a privilege character, inhibiting the default signals of the other classes in case of appearance of a default signal in said privileged class.

4. A process as in claim 3 for carrying out a diagnosis on systems of modules associated with at least one rotating member and receiving a speed status signal representative of the speed of rotation of said rotating member and its angular position at each moment, said process further comprising configuring the multiprocessor (21) in such a manner as to allocate a priority character to the speed status signal.

5. A process as in claim 4 for carrying out a diagnosis and wherein said vehicle includes a plurality of modules associated with one or more of the following members: a battery, an ignition rotor, an ignition coil, an injector, a flowmeter, a relay pump, air and water temperature sensors, a fuel inlet solenoid valve, the process comprising configuring said multiprocessor (21) in such a manner as to order the status and control signals in at least five classes to be arranged in the following order:
- a first class having a privilege character comprising signals of battery voltage, signals of weight control,
- a second class comprising a speed signal or ignition coil,
- a third class comprising a speed signal generated by the ignition rotor, a signal from the pump relay, or a signal from the injector control,
- a fourth class comprising signals from the flow meter or air temperature sensors,
- a fifth class comprising a solenoid valve signal or a water temperature sensor signal.

6. A diagnostic process as in claim 1 comprising:
preliminarily displaying the contents of the backup memory (42), selecting a predetermined combination of information to be displayed from a set of combinations corresponding to different types of diagnoses, and
displaying only the selected combination of information.

7. A diagnostic process as in claim 6, comprising selecting the diagnostic probram of the system to be tested and the combination of information to be displayed;
generating the successive display of menus bearing indications representative of the stored types of systems to be tested and the set of combinations to be displayed,
actuating a cursor for choosing indications contained in the menu.

8. A diagnostic process as in claim 6, displaying in real time at least one fraction of the read write memory for visualizing the value of the operating parameters.

9. A diagnostic process as in claim 1 comprising:
storing in a storage memory a table of aids to the repair comprising for each default signal, information for helping the repair,
displaying on request the information from this table which corresponds to a default signal when the status signal is displayed.

10. A diagnostic process as in claim 1 comprising:
imposing on each wiring harness (2) to a system to be tested an electric parameter for identifying the system to be tested, providing each diagnostic program with a code representative of the electric parameter of the system to be tested to which the diagnostic program corresponds, and thereafter verifying the concordance of the code and of the electric parameter to either proceed with the diagnosis in case of concordance, or to prevent the diagnosis in case of non-concordance.

11. A diagnostic process as in claim 1 comprising, for each period, digitizing the set of calibrated signals to be carried out in parallel.

12. A diagnostic apparatus for comprising in combination:
a set of wire harnesses (2) comprising at one end a standard connector (2a) and at the other end a branch connector (3) adapted to branch to the terminals of modules of a system to be tested for delivering status and control signals,
a formatting interface (15) having input connectors (16) corresponding to said standard connectors (2a), said interface comprising a plurality of calibrating modules (29, 30, 31) having their inputs arranged in parallel,
a multiprocessor (21) connected to the formatting interface (15) and comprising a plurality of counters and analog/digital converters, at least two processors (39, 40) organized as master/slave, a read write memory for storing in real time the digital signals obtained, and a backup memory (42) for storing defect signals and data associated with said defect signals,
memory means for storing a set of diagnostic programs corresponding to a set of systems to be tested, said memory means being connected to the multiprocessor (21),
connection means (28; 14, 46; 47) adapted to connect the multiprocessor (21) with a man/machine interface having display means and manual selection means,
electric feed means (43) provided with a connector for attachment to a battery (44) of an automotive vehicle, said means being adapted to convert the battery voltage to an appropriate regulated voltage for feeding to the apparatus.

13. A diagnostic apparatus as in claim 12, characterized in that the formatting interface comprises an interchangeable card (15) having a plug-in input connector (16) with a plurality of pins, corresponding to the standard connectors (2a), a plug-in output connector (17) having a plurality of pines for connection to the multiprocessor (21) and said calibrating modules (29, 30 31) being arranged in parallel between these connectors.

14. A diagnostic apparatus as in claim 13, characterized in that the formatting interface (15) comprises a plurality of calibrating modules of the following type: a module (29) for comparison of the status signal or the control signal with a calibrating threshold for delivering a logic signal as a function of that comparison, and-/or a tracking amplifier module (31) able to provide a comparison for delivering a calibrated analog signal, and/or a mass control module (30) able to compare the input impedance at a calibration threshold, for delivering a logic signal as a function of the comparison.

15. A diagnostic apparatus as in claim 12, in which the memories for storage of the diagnostic programs are carried by an interchangeable card (25) comprising a bidirectional plug-in connector (27) for connection of said memories with the multiprocessor (21).

16. A diagnostic apparatus as in claim 13, characterized in that the multiprocessor (21) comprises at least six counters per processor (39, 40), associated in groups of different powers, for carrying out measurements of time on the calibrated logic signals and on combinations of different complexes of these signals.

17. A diagnostic apparatus as in claim 12, characterized in that the multiprocessor (21) comprises a plurality of multipath converters, of a number adapted for digitizing in parallel the calibrated analog signals.

18. An apparatus as in claim 12, characterized in that it comprises display means (5) and integrated manual selection means (6), the means for connecting the same with the multiprocessor being of the plug-in type.

19. An apparatus as in claim 18, characterized in that the display means comprises an alphanumeric screen (5) with at least four lines of twenty characters and the manual selection means comprising keys (6) for selecting and moving a cursor on the display screen (5).

20. An apparatus as in claim 12, characterized in that the connection with the man/machine interface comprises a retrievable connector in waiting.

21. An apparatus as in claim 20, characterized in that it comprises a standardized serial connection (46) connected to the multiprocessor (21) and having a retrievable connector (14) for connection with an external system for exchange with the multiprocessor.

22. An apparatus as in claim 16 comprising:
a parallelipipedic housing (1) open at two ends and provided internally with card receiving slots, the formatting interface card (15) and the storage memory cards (25) being plugged in such a manner as to be removable from the slots,
a multiprocessor card (21),
a connection card (28) with the display means (5) and the manual selection means (6),
and two members (9, 10) for closing the housing (1) at its open ends, one (9) being removable and carrying the inter-card connections and the other (10) carrying the input connectors (11-14) plugged into the formatting interface card (15).

23. An apparatus as in claim 22, characterized in that the housing (1) comprises a window (4) arranged on a front face, to the rear of which are provided the screen (5), the display means and sealed buttons (6) for manual selection, a protective cover (7) mounted on slides being associated with said front face to be able to be moved between two positions: one position in which it hides and protects the display screen (5) and the manual selection buttons (6), and a position in which it reveals the latter.

24. An apparatus as in claim 23, characterized in that each wire harness (2) comprises resistors, differing from one harness to another, wired into said harness.

25. A formatting interface card (15) for use with an apparatus according to claim 12, characterized in that it comprises:
an plug-in input connector (16) having a plurality of pins,
a plug-in output connector (17) having a plurality of pins,
a plurality of calibrating modules (29, 30, 31) arranged in parallel between the input and the output connectors.

* * * * *